US012685094B2

(12) United States Patent
Huang et al.

(10) Patent No.: US 12,685,094 B2
(45) Date of Patent: Jul. 14, 2026

(54) MICRO-LED WAFER TESTING DEVICE AND MICRO-LED WAFER TESTING METHOD

(71) Applicant: INGENTEC CORPORATION, Miaoli County (TW)

(72) Inventors: Yi-Chuan Huang, Miaoli County (TW); Hsiao-Lu Chen, Miaoli County (TW); Ai-Sen Liu, Miaoli County (TW); Hsiang-An Feng, Miaoli County (TW)

(73) Assignee: INGENTEC CORPORATION, Miaoli County (TW)

( * ) Notice: Subject to any disclaimer, the term of this patent is extended or adjusted under 35 U.S.C. 154(b) by 176 days.

(21) Appl. No.: 18/824,884

(22) Filed: Sep. 4, 2024

(65) Prior Publication Data

US 2025/0233028 A1     Jul. 17, 2025

(30) Foreign Application Priority Data

Jan. 15, 2024     (TW) ................................. 113101568

(51) Int. Cl.
| | |
|---|---|
| *G01M 11/02* | (2006.01) |
| *H10H 20/857* | (2025.01) |
| *H10P 74/00* | (2026.01) |
| *H10W 90/00* | (2026.01) |

(52) U.S. Cl.
CPC ......... *H10P 74/273* (2026.01); *H10H 20/857* (2025.01); *H10W 90/00* (2026.01)

(58) Field of Classification Search
CPC .... H10P 74/273; H10H 20/857; G01M 11/02; G01M 11/0207; G01R 31/2844; G01R 31/2635
See application file for complete search history.

(56) References Cited

U.S. PATENT DOCUMENTS

| | | | |
|---|---|---|---|
| 10,578,665 | B2 | 3/2020 | Regau |
| 11,251,222 | B2 * | 2/2022 | Kwag ........................ G01J 3/50 |
| 2010/0298965 | A1 | 11/2010 | Liu et al. |
| 2020/0020825 | A1 * | 1/2020 | Yang .................... H10H 20/018 |
| 2020/0185283 | A1 * | 6/2020 | Henley ................ G01R 31/312 |

(Continued)

FOREIGN PATENT DOCUMENTS

| | | |
|---|---|---|
| CN | 106842073 A | 6/2017 |
| CN | 115436835 A | 12/2022 |

(Continued)

*Primary Examiner* — Dominic E Hawkins
(74) *Attorney, Agent, or Firm* — CKC & Partners Co., LLC

(57) ABSTRACT
A micro-LED wafer testing device, being applied to test a micro-LED wafer including a metal substrate and a plurality of micro-LEDs disposed at the metal substrate periodically, includes a transparent substrate, a plurality of through holes disposed at the transparent substrate periodically, and a plurality of testing elements respectively disposed at the through holes. Each of the testing elements includes a metal post filled in one of the through holes, and a dielectric portion connected to a lower end of the metal post. The dielectric portions of the testing elements contact a plurality of contacted members of the micro-LEDs, and a top end of each of the metal posts and the metal substrate are powered to conduct an illustrating test for the contacted members of the micro-LEDs.

15 Claims, 8 Drawing Sheets

(56)          References Cited

U.S. PATENT DOCUMENTS

| | | | |
|---|---|---|---|
| 2021/0091259 A1* | 3/2021 | John | H10H 20/01 |
| 2021/0091281 A1 | 3/2021 | LV et al. | |
| 2021/0407975 A1* | 12/2021 | Hu | H10H 29/142 |
| 2023/0184819 A1* | 6/2023 | Lin | G06T 7/0004 |
| | | | 324/414 |
| 2024/0429343 A1* | 12/2024 | Wang | H10H 20/01335 |
| 2025/0046660 A1* | 2/2025 | Ng | H10H 29/142 |
| 2025/0374739 A1* | 12/2025 | Asad | H10H 29/857 |

FOREIGN PATENT DOCUMENTS

| | | | | |
|---|---|---|---|---|
| CN | 116660712 A | 8/2023 | | |
| KR | 10-2022-0170273 A | 12/2022 | | |
| KR | 10-2023-0121225 A | 8/2023 | | |
| WO | WO-2019172707 A1 * | 9/2019 | | H10P 72/30 |
| WO | WO-2023081378 A1 * | 5/2023 | | H10W 90/00 |

* cited by examiner

MICRO-LED WAFER TESTING DEVICE AND MICRO-LED WAFER TESTING METHOD

RELATED APPLICATIONS

This application claims priority to Taiwan Application Serial Number 113101568, filed Jan. 15, 2024, which is herein incorporated by reference.

BACKGROUND

Technical Field

The present disclosure relates to a wafer testing device and a wafer testing method. More particularly, the present disclosure relates to a micro-LED wafer testing device and a micro-LED wafer testing method.

Description of Related Art

Recently, micro-LED (micro light emitting diode) becomes a new effective light source. During manufacture, a plurality of micro-LEDs are formed on a wafer and then are cut and transferred. Moreover, the micro-LEDs may be tested after producing the micro-LEDs wafer.

However, the size of the micro-LED is small, and if the micro-LED test is conducted by using conversional probes, electrodes on the micro-LEDs may be damaged. In addition, there is a difficulty for producing precise probes to match the size of the micro-LEDs, and improvement thereof is required.

Based on the aforementioned problems, how to improve a micro-LEDs wafer testing device for preventing the micro-LEDs from being damaged during test becomes a target that those in the field pursue.

SUMMARY

According to one aspect of the present disclosure, a micro-LED wafer testing device, being applied to test a micro-LED wafer, is provided. The micro-LED wafer includes a metal substrate and a plurality of micro-LEDs, and the micro-LEDs are disposed at the metal substrate periodically. The micro-LED wafer testing device includes a transparent substrate, a plurality of through holes disposed at the transparent substrate periodically, and a plurality of testing elements respectively disposed at the through holes. Each of the testing elements includes a metal post filled in one of the through holes, and a dielectric portion connected to a lower end of the metal post. The dielectric portions of the testing elements contact a plurality of contacted members of the micro-LEDs, and a top end of each of the metal posts and the metal substrate are powered to conduct an illustrating test for the contacted members of the micro-LEDs.

According to another aspect of the present disclosure, a micro-LED wafer testing method includes a micro-LED wafer testing device placing step and a testing step. In the micro-LED wafer testing device placing step, a micro-LED wafer testing device is placed on a micro-LED wafer. The micro-LED wafer includes a metal substrate and a plurality of micro-LEDs disposed at the metal substrate periodically. A plurality of testing elements of the micro-LED wafer testing device contact a plurality of contacted members of the micro-LEDs. The testing elements are arranged periodically, each of the testing elements includes a metal post and a dielectric portion, and each of the dielectric portions is connected to a lower end of each of the metal posts and faces toward the micro-LED wafer. In the testing step, a top end of each of the metal posts and the metal substrate are powered to conduct an illustrating test for the contacted members of the micro-LEDs.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
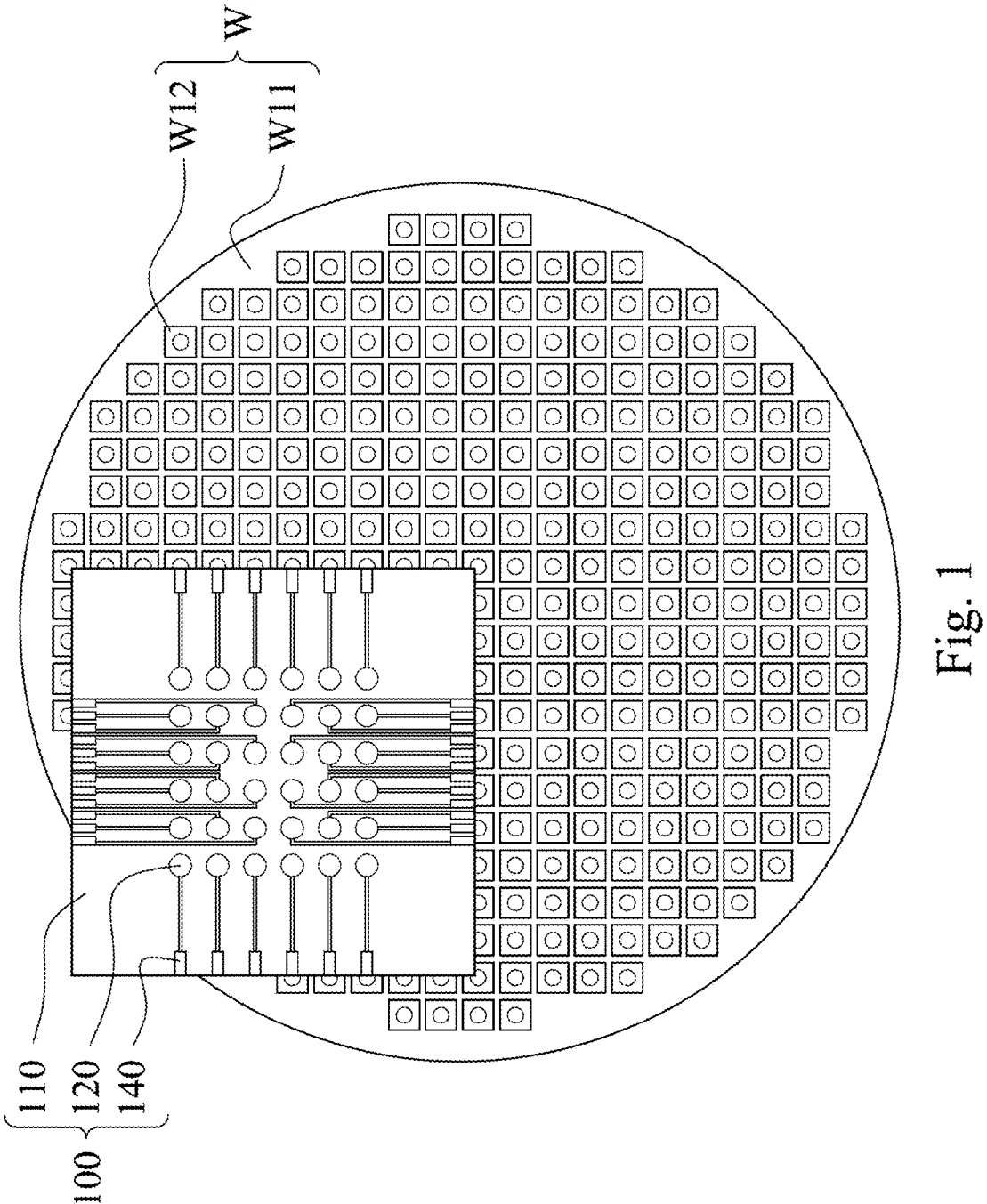
FIG. 1 is a top schematic view of a micro-LED wafer testing device according to a first embodiment of the present disclosure testing a micro-LED wafer.

The embodiments of the present disclosure will be illustrated with drawings hereinafter. In order to clearly describe the content, many practical details will be mentioned with the description hereinafter. However, it will be understood by the reader that the practical details will not limit the present disclosure. In other words, in some embodiment of the present disclosure, the practical details are not necessary. Additionally, in order to simplify the drawings, some conventional structures and elements will be illustrated in the drawings in a simple way; the repeated elements may be labeled by the same or similar reference numerals.

In addition, the terms first, second, third, etc. are used herein to describe various elements or components, these elements or components should not be limited by these terms. Consequently, a first element or component discussed below could be termed a second element or component. Moreover, the combinations of the elements, the components, the mechanisms and the modules are not well-known, ordinary or conventional combinations, and whether the combinations can be easily completed by the one skilled in the art cannot be judged based on whether the elements, the components, the mechanisms or the module themselves are well-known, ordinary or conventional.

Figure 2:
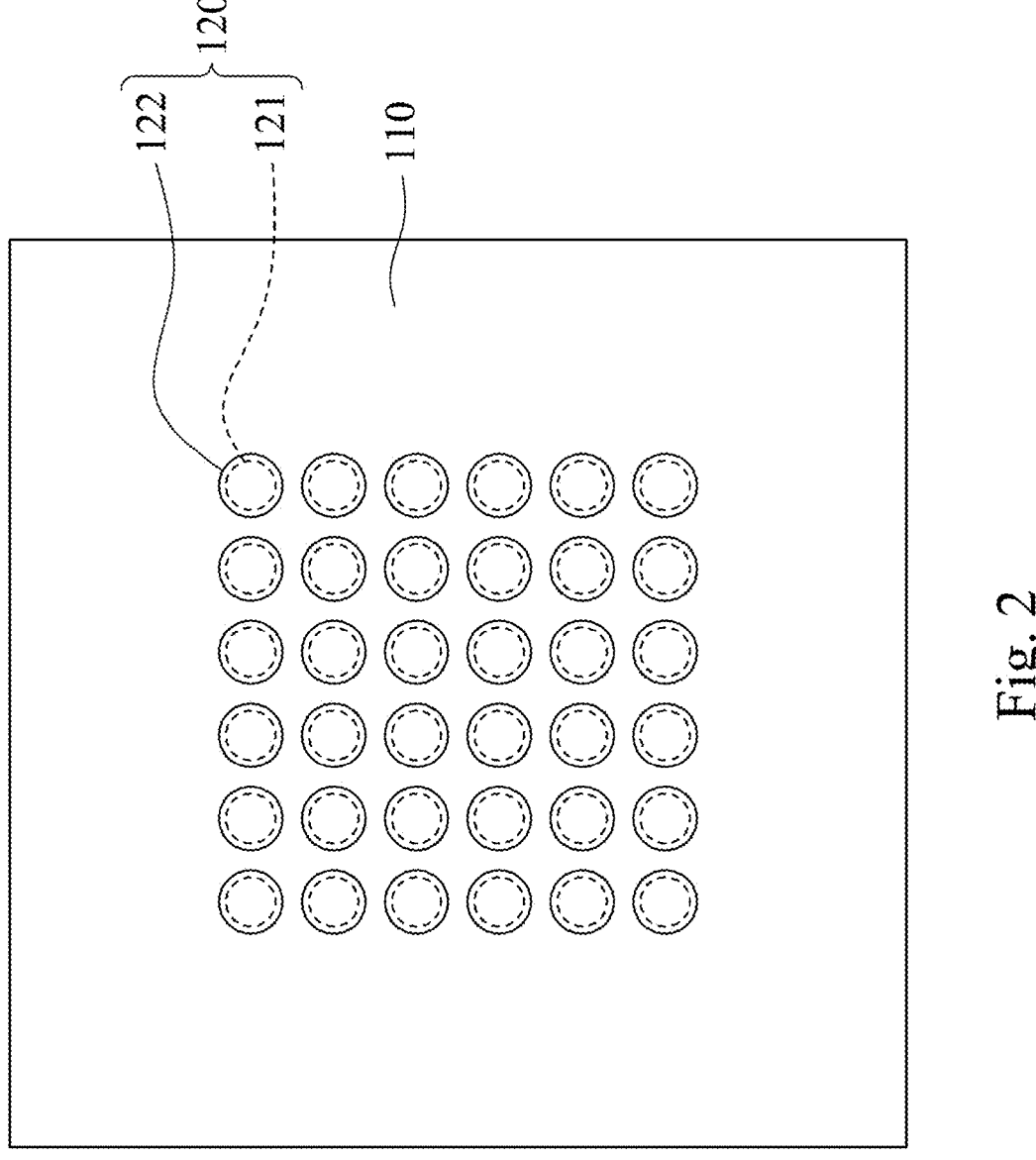
FIG. 2 is a bottom schematic view of the micro-LED wafer testing device of the first embodiment of FIG. 1.
Figures 3, 4:
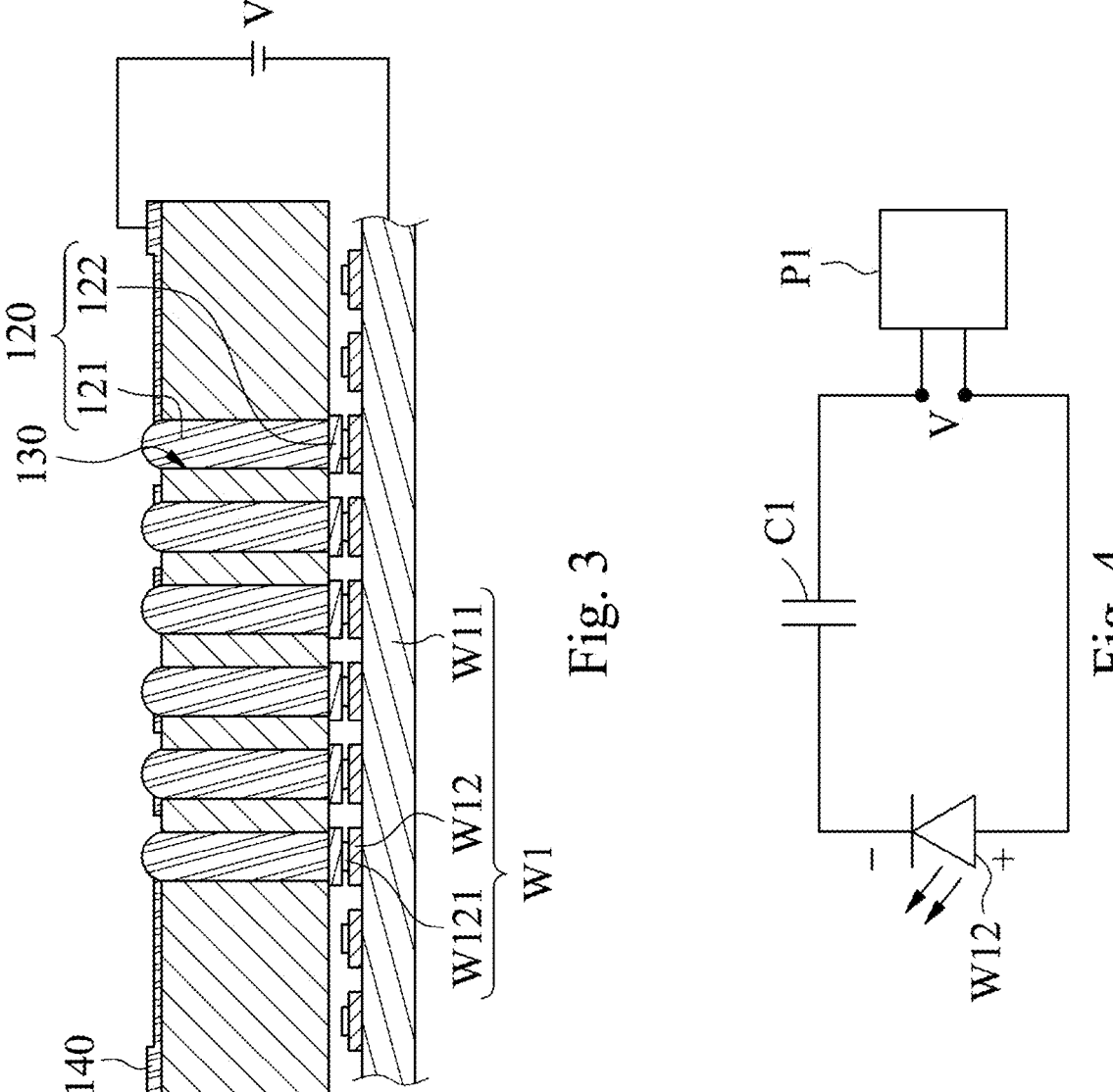
FIG. 3 is a partial cross-sectional schematic view showing that the micro-LED wafer testing device of the first embodiment of FIG. 1 and the micro-LED wafer are powered.
FIG. 4 is a schematic view showing a controller and an equivalent circuit of the micro-LED wafer testing device of the first embodiment of FIG. 1 testing the micro-LED wafer.

FIG. 1 is a top schematic view of a micro-LED wafer testing device 100 according to a first embodiment of the present disclosure testing a micro-LED wafer W1. FIG. 2 is a bottom schematic view of the micro-LED wafer testing device 100 of the first embodiment of FIG. 1. FIG. 3 is a partial cross-sectional schematic view showing that the micro-LED wafer testing device 100 of the first embodiment of FIG. 1 and the micro-LED wafer W1 are powered. The micro-LED wafer testing device 100 is applied to test the micro-LED wafer W1. The micro-LED wafer W1 includes a metal substrate W11 and a plurality of micro-LEDs W12, and the micro-LEDs W12 are disposed at the metal substrate W11 periodically.

The micro-LED wafer testing device 100 includes a transparent substrate 110, a plurality of through holes 130 disposed at the transparent substrate 110 periodically, and a plurality of testing elements 120 respectively disposed at the through holes 130. Each of the testing elements 120 includes a metal post 121 filled in one of the through holes 130 and a dielectric portion 122 connected to a lower end of the metal post 121. The dielectric portions 122 of the testing elements 120 contact a plurality of contacted members of the micro-LEDs W12, and a top end of each of the metal posts 121 and the metal substrate W11 are powered to conduct an illustrating test for the contacted members of the micro-LEDs W12.

Therefore, after being powered, each of the dielectric portions 122 becomes a capacitor C1 (labeled in FIG. 4), the metal substrate W11, each of the micro-LEDs W12 and each of the testing elements 120 becomes a circuit loop, and each of the micro-LEDs W12 may illustrate. Consequently, a goal of effectively testing the micro-LEDs W12 is achieved, and the dielectric portions 122 may not damage electrodes W121 of the micro-LEDs W12.

The transparent substrate 110 may be made of a glass, and each of the through holes 130 may penetrate the transparent substrate 110 to form a through glass via (TGV) substrate structure. The through holes 130 may be arranged at the transparent substrate 110 as a high density array.

Each of the metal posts 121 may be filled in each of the through holes 130. The top end of each of the metal posts 121 may be higher than an upper surface of the transparent substrate 110. The lower end of each of the metal posts 121 may have a plane structure for connecting each of the dielectric portions 122. Each of the metal posts 121 may be made of copper, and each of the dielectric portions 122 may be made of $SiO_2$, but the present disclosure is not limited thereto. Each of the metal posts 121 may be made of any metal which is conductive, and each of the dielectric portions 122 may be made of any dielectric material. Each of the dielectric portions 122 may be circular plate-shaped, and a diameter thereof is larger than a diameter of each of the metal posts 121. Each of the dielectric portions 122 may have a flat surface, and therefore the dielectric portions 122 may not damage the micro-LEDs W12 as touching the micro-LEDs W12.

The micro-LED wafer testing device 100 may further include a plurality of electrode pads 140 disposed at the transparent substrate 110, and each of the electrode pads 140 is signally connected to the top end of each of the metal posts 121. As shown in FIG. 1, a number of the electrode pads 140 corresponds to a number of the metal posts 121. The electrode pads 140 may be arranged at an edge of the upper surface of the transparent substrate 110, and the electrode pads 140 are signally connected to the metal posts 121, respectively.

As shown in FIG. 3, in the first embodiment, two of the contacted members that are contacted by adjacent two of the dielectric portions 122 are adjacent to each other, and each of the dielectric portions 122 contacts the electrodes W121 of the contacted members of the micro-LEDs W12. Precisely, a testing zone is formed on the micro-LED wafer W1 by the micro-LED wafer testing device 100. A number of the micro-LEDs W12 in the testing zone is equal to a number of the testing elements 120. Hence, the contacted members of the micro-LEDs W12 are arranged continuously and correspond to the testing elements 120 one by one. During test, each of the dielectric portions 122 may directly contact the electrode W121 of each of the micro-LEDs W12.

FIG. 4 is a schematic view showing a controller P1 and an equivalent circuit of the micro-LED wafer testing device 100 of the first embodiment of FIG. 1 testing the micro-LED wafer W1. Please refer to FIG. 4 with references of FIGS. 1 to 3, each of the micro-LEDs W12 may be a vertical micro-LED. Hence, the electrode W121 of each of the micro-LEDs W12 and the metal substrate W11 may be served as a P electrode and an N electrode, respectively. As the controller P1 provides a plus wave voltage V to the top end of each of the metal posts 121 and the metal substrate W11 for powering each of the micro-LEDs W12, the dielectric portion 122 which is switched between two conductive layers, i.e., the metal post 121 and the electrode W121, may become the capacitor C1, and an electric circuit may be formed to power each of the micro-LEDs W12. Since the transparent substrate 110 is transparent, the light emitted from each of the micro-LEDs W12 may not be blocked. Therefore, a camera may be disposed at a side of the micro-LED wafer testing device 100 facing away from the micro-LED wafer W1, and the camera shoots each of the micro-LEDs W12 to confirm whether each of the micro-LEDs W12 illustrates normally. Moreover, a wave length of each of the micro-LEDs W12 may be measured. In addition, since the transparent substrate 110 has a good insulating property and a good anti-noise property, the measured S/N ratio is better.

Figure 5:
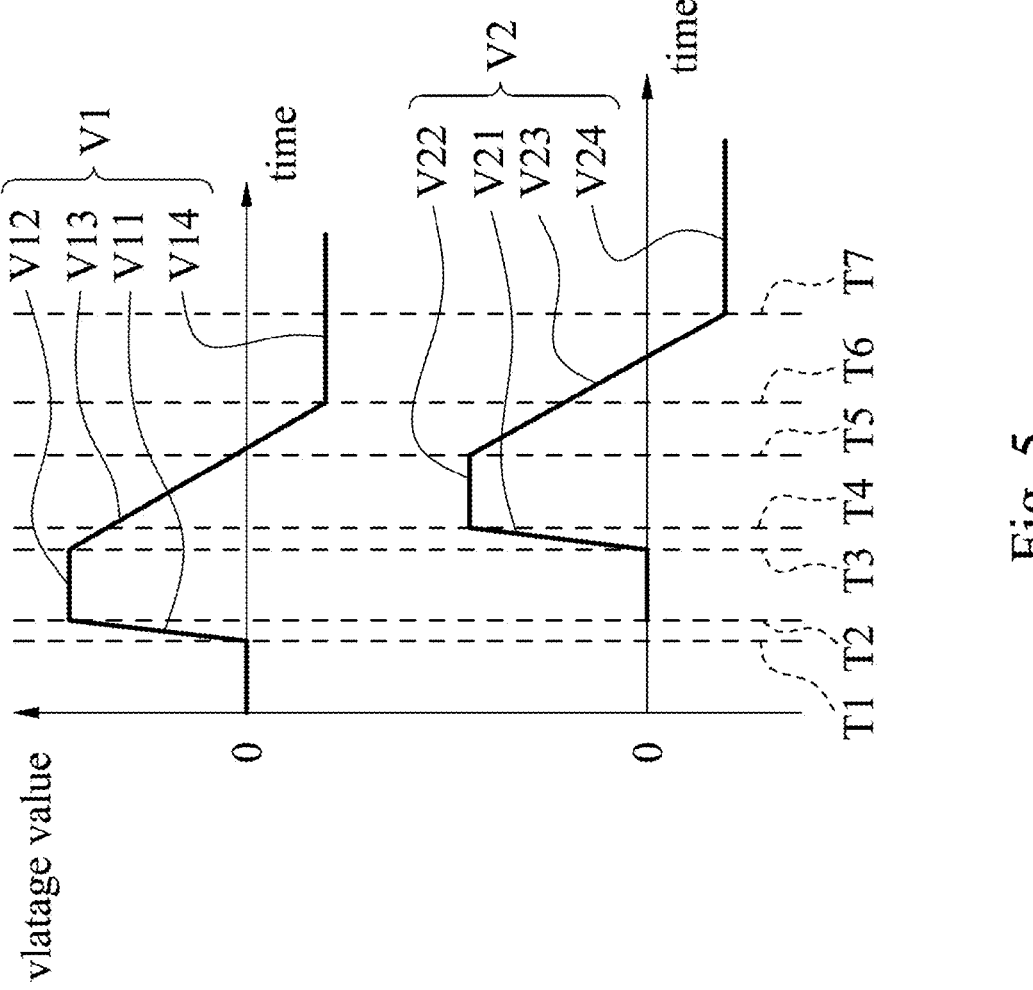
FIG. 5 is a relation showing two plus wave voltages and a time of the micro-LED wafer testing device of the first embodiment of FIG. 1 testing the micro-LED wafer.
Figure 6:
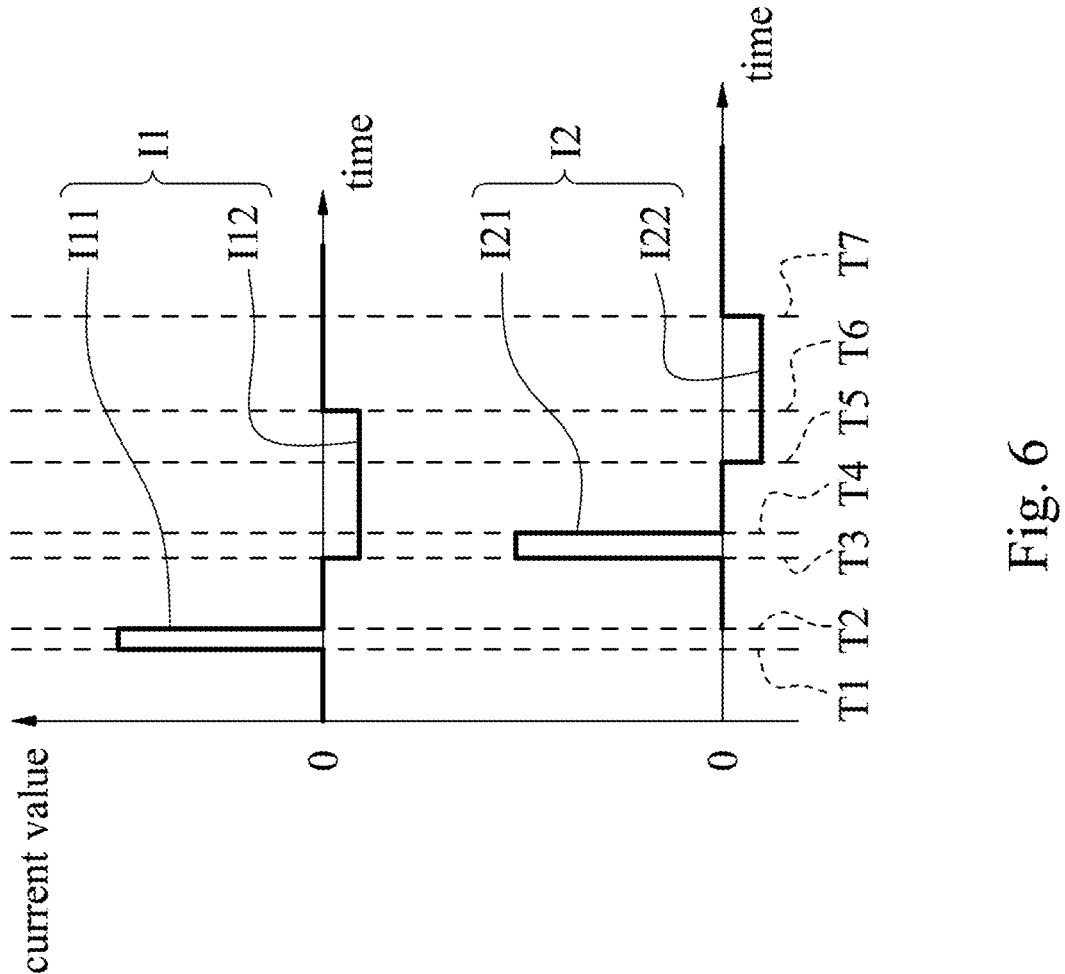
FIG. 6 is a relation showing two currents and the time of the micro-LED wafer testing device of the first embodiment of FIG. 1 testing the micro-LED wafer.

FIG. 5 is a relation showing two plus wave voltages V1, V2 and a time of the micro-LED wafer testing device 100 of the first embodiment of FIG. 1 testing the micro-LED wafer W1. FIG. 6 is a relation showing two currents I1, I2 and the time of the micro-LED wafer testing device 100 of the first embodiment of FIG. 1 testing the micro-LED wafer W1. Each of the plus wave voltages V includes a voltage boosting segment, a positive voltage segment, a voltage decreasing segment and a negative voltage segment in order, the controller P1 provides a first member of the plus wave voltages V (the plus wave voltage V1) to power a first powered member of the metal posts 121, and the controller P1 provides the voltage boosting segment V21 of a second member of the plus wave voltages V (the plus wave voltage V2) to power a second powered member of the metal posts 121 within the voltage decreasing segment V13 of the plus wave voltage V1.

To be more specific, the metal post 121 of each of the testing elements 120 is powered individually and sequentially by each of the electrode pads 140. Therefore, the metal posts 121 may be named as the first powered member, the second powered member and so on based on the powering order. The plus wave voltage V provides for the first powered member and the second member may be named as the first member and the second member, and the first member and the second member are represented by the plus wave voltage V1 and the plus wave voltage V2, respectively. As shown in FIG. 5, the voltage boosting segment V11 represents the plus wave voltage V1 within a time period from a time point T1 to a time point T2, and the voltage value increases positively from zero. The positive voltage segment V12 represents the plus wave voltage V1 within a time period from the time point T2 to a time point T3, and the voltage value remains a positive value. The voltage decreasing segment V13 represents the plus wave voltage V1 within a time period from the time point T3 to a time point T6, and the voltage value decreases from the positive value to a negative value. The negative voltage segment V14 represents the plus wave voltage V1 after the time point T6, and the voltage value remains the negative value. Based on the conditions of $Q=C \times V_{in}$ and $dQ/d_t = I_{in} = C$ [$dV_{in}/d_t$], the current 11 may be obtained as shown in FIG. 6. Q represents the electric charge, C represents the capacitor value of the capacitor C1, $V_{in}$ represents the voltage value of the plus wave voltage V1, $I_{in}$ represents the current value of the current 11, and dt represents the differentiation of the time. It is noted that, as the conditions are applied to the plus wave voltage V2, $V_{in}$ represents the voltage value of the plus wave voltage V2, and $I_{in}$ represents the current value of the current 12. The current 11 may include a positive current segment 111 and a negative current segment 112. For the current 11 corresponding to the plus wave voltage V1, the positive current segment 111 represents the current 11 within the time period from the time point T1 to the time point T2, and the current value remains a positive value. The negative current segment 112 represents the current 11 within the time period from the time point T3 to a time point T5, and the current value remains a negative value. Each of the micro-LEDs W12 illustrates as being in the positive current segment 111, and each of the micro-LEDs W12 does not illustrate as being in the negative current segment 112 or as the current value is zero. A parasitic capacitance of each of the micro-LEDs W12 may be eliminated as each of the micro-LEDs W12 is switched between a positive voltage and a negative voltage, thereby preventing the testing from affecting by the light residual after each of the micro-LEDs W12 is turned off. Hence, the first powered member of the micro-LEDs W12 illustrates within the positive current segment 111 from the time point T1 to the time point T2, and does not illustrate within the negative current segment 112 from the time point T3 to the time point T5. Since the parasitic capacitance is eliminated, the first powered member of the micro-LEDs W12 does not illustrate after the time point T5.

The voltage boosting segment V21 represents the plus wave voltage V2 within a time period from the time point T3 to a time point T4. The positive voltage segment V22 represents the plus wave voltage V2 within a time period from the time point T4 to the time point T5. The voltage decreasing segment V23 represents the plus wave voltage V2 within a time period from the time point T5 to a time point T7. The negative voltage segment V24 represents the plus wave voltage V2 after the time point T7. Therefore, the current 12 as shown in FIG. 6 is obtained. For the current 12 corresponding to the plus wave voltage V2, the positive current segment 121 represents the current 12 within the time period from the time point T3 to the time point T4, and the negative current segment 122 represents the current 12 within a time period from the time point T4 to the time point T7. The second powered member of the micro-LEDs W12 may illustrate within the positive current segment 121 from the time point T3 to the time point T4, while the first powered member of the micro-LEDs W12 in the negative current segment 112 does not illustrate. As a result, the testing of the second powered member of the micro-LEDs W12 is not affected.

Since the testing elements 120 touch the micro-LEDs W12 one by one, a goal that using a specific voltage value to generate a specific brightness can be arrived. In other words, in the first embodiment, whether the brightness of each of the micro-LEDs W12 satisfies a spec or whether each of the micro-LEDs W12 illustrate but the brightness is not enough may be tested by giving a specific voltage value to each of the micro-LEDs W12. Therefore, the characteristic of each of the micro-LEDs W12 may be effectively tested, and noise affection may be prevented.

Figure 7:
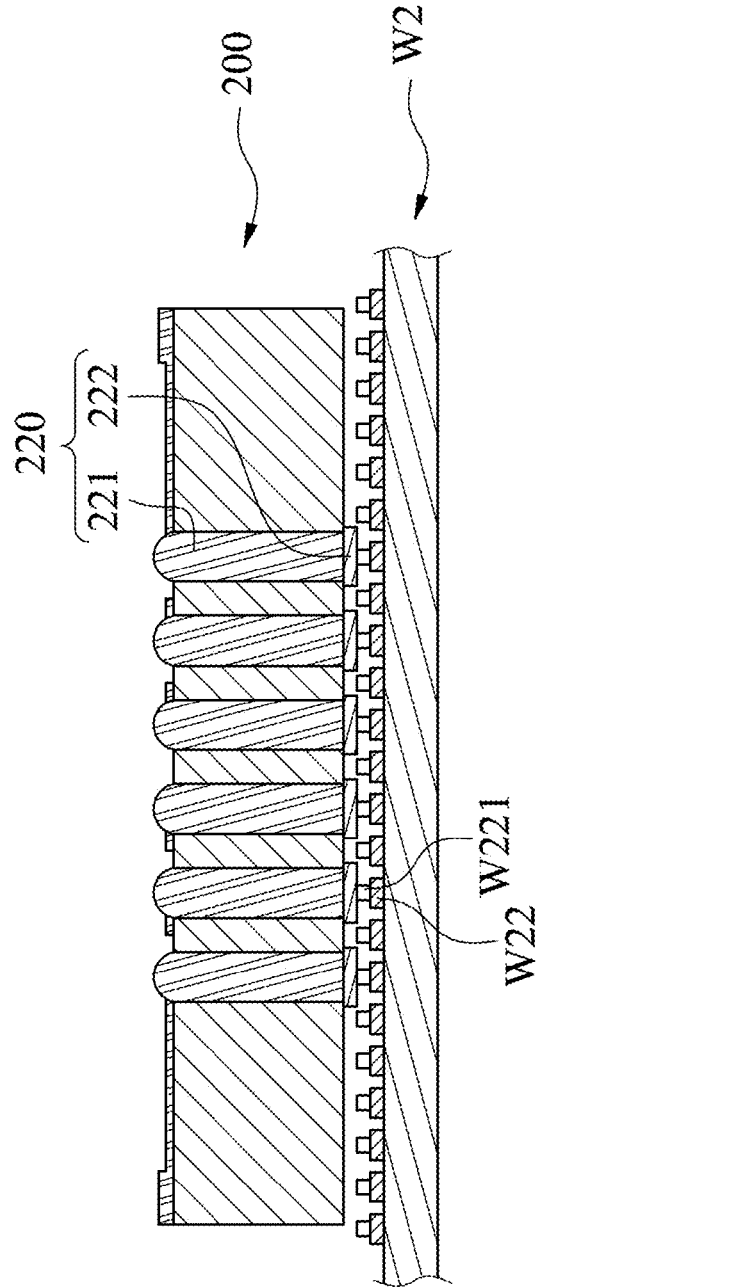
FIG. 7 is one partial cross-sectional schematic view of a micro-LED wafer testing device according to a second embodiment of the present disclosure testing a micro-LED wafer.
Figure 8:
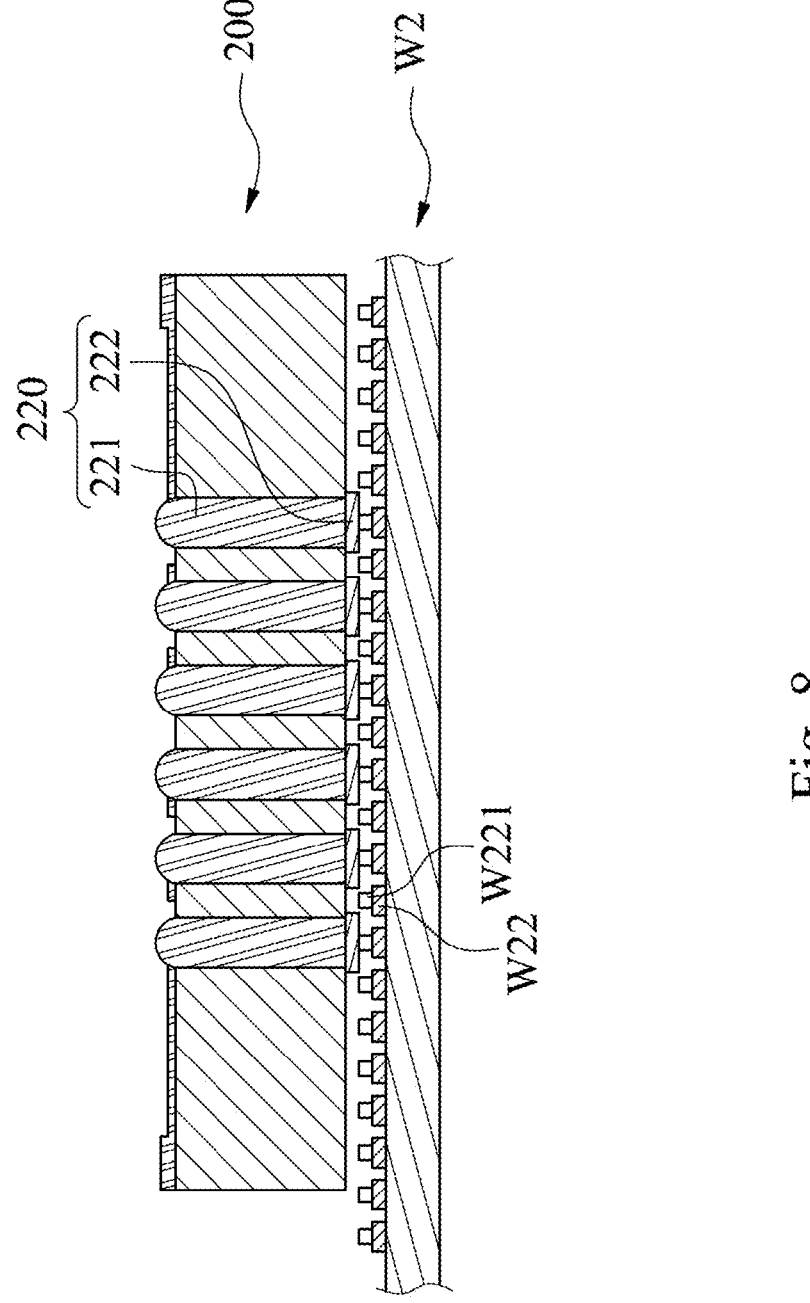
FIG. 8 is another partial cross-sectional schematic view of the micro-LED wafer testing device of the second embodiment of FIG. 7 testing the micro-LED wafer.

FIG. 7 is one partial cross-sectional schematic view of a micro-LED wafer testing device 200 according to a second embodiment of the present disclosure testing a micro-LED wafer W2. FIG. 8 is another partial cross-sectional schematic view of the micro-LED wafer testing device 200 of the second embodiment of FIG. 7 testing the micro-LED wafer W2. The micro-LED wafer testing device 200 of the second embodiment is similar to the micro-LED wafer testing device 100 of the first embodiment and includes a plurality of testing elements 220. Each of the testing elements 220 includes a metal post 221 and a dielectric portion 222. As testing the micro-LED wafer W2, at least one of a plurality of none-contacted members of micro-LEDs W22 that is not contacted by the dielectric portions 222 is located between two of the contacted members that are contacted by adjacent two of the dielectric portions 222.

To be more specific, a size of each of the micro-LEDs W22 is smaller and a density of the micro-LEDs W22 is larger. Therefore, in a testing zone of the micro-LED wafer formed by the micro-LED wafer testing device 200, a number of the micro-LEDs W22 and a number of the testing elements 220 are not equal. Consequently, the dielectric portions 222 may not correspond to the micro-LEDs W22 one by one continuously, and may correspond to the micro-LEDs W22 one by one periodically. For example, if a number of the testing elements 220 is six, and a number of the micro-LEDs W22 within the testing zone is at least eleven, only the electrodes W221 of six of the micro-LEDs W22 may be contacted by the testing elements 220 at the same time. The micro-LEDs W22 that are not contacted, being called none-contacted members, and the micro-LEDs W22 that are contacted, being called contacted members, are staggered. As shown in FIGS. 7 and 8, after the six contacted members are tested, the micro-LED wafer testing device 200 may be moved to contact another six none-contacted members which become new-contacted members.

Figure 9:
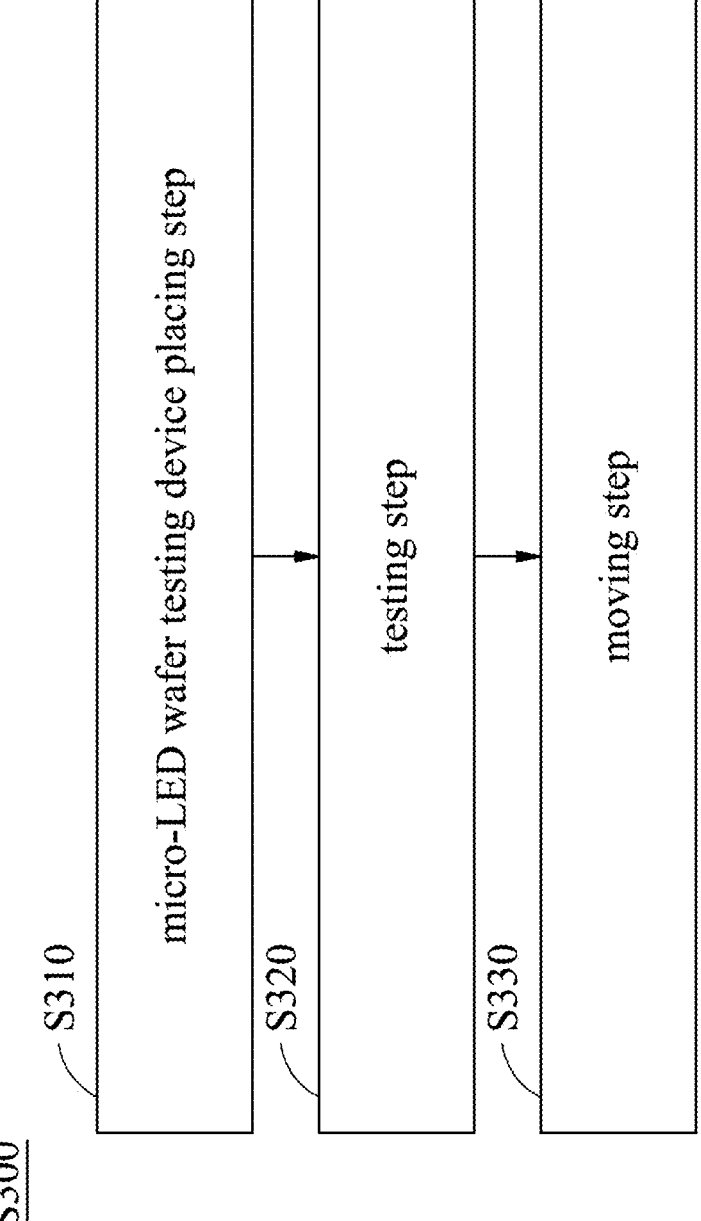
FIG. 9 is a block flow chart of a micro-LED wafer testing method according to a third embodiment of the present disclosure.

FIG. 9 is a block flow chart of a micro-LED wafer testing method S300 according to a third embodiment of the present disclosure. The micro-LED wafer testing method S300 includes a micro-LED wafer testing device placing step S310 and a testing step S320.

In the micro-LED wafer testing device placing step S310, a micro-LED wafer testing device is placed on a micro-LED wafer. The micro-LED wafer includes a metal substrate and a plurality of micro-LEDs disposed at the metal substrate periodically. A plurality of testing elements of the micro-LED wafer testing device contact a plurality of contacted members of the micro-LEDs. Each of the testing elements is arranged periodically and includes a metal post and a dielectric portion, and each of the dielectric portions is connected to a lower end of each of the metal posts and faces toward the micro-LED wafer.

In the testing step S320, a top end of each of the metal posts and the metal substrate are powered to conduct an illustrating test for the contacted members of the micro-LEDs.

As shown in the first embodiment of FIGS. 1 to 3, in the micro-LED wafer testing device placing step S310, the number of the testing elements 120 corresponds to a number of the contacted members of the micro-LEDs W12, and each of the dielectric portions 122 touches the electrode W121 of each of the micro-LEDs W12. In other words, the testing elements 120 contact the micro-LEDs W12 one by one continuously. During test, each of the dielectric portions 122 may directly contact the electrode W121 of each of the micro-LEDs W12.

Owing to the size, as the micro-LED wafer testing device 100 is placed on the micro-LED wafer W1, only the contacted members of the micro-LEDs W12 may be contacted by the testing elements 120. Hence, the micro-LED wafer testing method S300 may further include a moving step S330. As the contacted members of the micro-LEDs W12 complete the illustrating test, the micro-LED wafer testing device 100 is moved, and the testing elements 120 of the micro-LED wafer testing device 100 contact a plurality of new-contacted members of the micro-LEDs W12. Specially, the micro-LED wafer testing device 100 may be move to a right side of FIG. 1 to change a position of the micro-LED wafer testing device 100, and the testing elements 120 may correspond to the micro-LEDs W12 that are not tested. It is noted that, if a size of the micro-LED wafer testing device is equal to a size of the micro-LED wafer, and all the micro-LEDs can be tested by the micro-LED wafer testing device, no moving step is required, but the present disclosure is not limited thereto.

As shown in the second embodiment of FIGS. 7 to 8, in the testing zone, the number of the micro-LEDs W22 is not equal to the number of the testing elements 220, and in the moving step S330, the micro-LED wafer testing device 200 may restart a testing after moving to the right side with a moving distance equal to one micro-LED W22.

In the testing step S320, as shown in FIGS. 3 to 5, the plus wave voltages V are respectively provided to the metal posts 121 by the controller P1. Each of the plus wave voltages V may include the voltage boosting segment, the positive voltage segment, the voltage decreasing segment and the negative voltage segment in order. The controller P1 provides the first member of the plus wave voltages V (the plus wave voltage V1) to power the first powered member of the metal posts 121, and the controller P1 provides the voltage boosting segment V21 of the second member of the plus wave voltages V (the plus wave voltage V2) to power the second powered member of the metal posts 121 within the voltage decreasing segment V13 of the plus wave voltage V1. The details are identical to description of the first embodiment, and will not be repeated.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A micro-LED wafer testing device, being applied to test a micro-LED wafer, the micro-LED wafer comprising a metal substrate and a plurality of micro-LEDs, the micro-LEDs disposed at the metal substrate periodically, the micro-LED wafer testing device comprising:
   a transparent substrate;
   a plurality of through holes disposed at the transparent substrate periodically; and a plurality of testing elements respectively disposed at the through holes, each of the testing elements comprising:
      a metal post filled in one of the through holes; and
      a dielectric portion connected to a lower end of the metal post;
   wherein the dielectric portions of the testing elements contact a plurality of contacted members of the micro-LEDs, and a top end of each of the metal posts and the metal substrate are powered to conduct an illustrating test for the contacted members of the micro-LEDs.

2. The micro-LED wafer testing device of claim 1, wherein two of the contacted members that are contacted by adjacent two of the dielectric portions are adjacent to each other.

3. The micro-LED wafer testing device of claim 1, wherein at least one of a plurality of none-contacted members of the micro-LEDs that is not contacted by the dielectric portions is located between two of the contacted members that are contacted by adjacent two of the dielectric portions.

4. The micro-LED wafer testing device of claim 1, further comprising:
   a plurality of electrode pads disposed at the transparent substrate, each of the electrode pads being signally connected to the top end of each of the metal posts.

5. The micro-LED wafer testing device of claim 4, wherein the electrode pads are arranged at an edge of an upper surface of the transparent substrate.

6. The micro-LED wafer testing device of claim 1, wherein the lower end of each of the metal posts has a plane structure.

7. The micro-LED wafer testing device of claim 1, wherein each of the metal posts is made of copper, and each of the dielectric portions is made of $SiO_2$.

8. The micro-LED wafer testing device of claim 1, wherein a diameter of each of the dielectric portions is larger than a diameter of each of the metal posts.

9. The micro-LED wafer testing device of claim 1, wherein each of the dielectric portions has a flat surface.

10. A micro-LED wafer testing method, comprising:
   a micro-LED wafer testing device placing step, wherein a micro-LED wafer testing device is placed on a micro-LED wafer, the micro-LED wafer comprises a metal substrate and a plurality of micro-LEDs disposed at the metal substrate periodically, a plurality of testing elements of the micro-LED wafer testing device contact a plurality of contacted members of the micro-LEDs, the testing elements are arranged periodically, each of the testing elements comprises a metal post and a dielectric portion, and each of the dielectric portions is connected to a lower end of each of the metal posts and faces toward the micro-LED wafer; and
   a testing step, wherein a top end of each of the metal posts and the metal substrate are powered to conduct an illustrating test for the contacted members of the micro-LEDs.

11. The micro-LED wafer testing method of claim 10, wherein in the testing step, a plurality of plus wave voltages are respectively provided to the metal posts by a controller.

12. The micro-LED wafer testing method of claim 11, wherein in the testing step, each of the plus wave voltages comprises a voltage boosting segment, a positive voltage segment, a voltage decreasing segment and a negative voltage segment in order, the controller provides a first member of the plus wave voltages to power a first powered member of the metal posts, and the controller provides the voltage boosting segment of a second member of the plus wave voltages to power a second powered member of the metal posts within the voltage decreasing segment of the first member of the plus wave voltages.

13. The micro-LED wafer testing method of claim 10, further comprising a moving step, wherein as the contacted members of the micro-LEDs complete the illustrating test, the micro-LED wafer testing device is moved, and the testing elements of the micro-LED wafer testing device contact a plurality of new-contacted members of the micro-LEDs.

14. The micro-LED wafer testing method of claim 10, wherein in the micro-LED wafer testing device placing step, two of the contacted members that are contacted by adjacent two of the dielectric portions are adjacent to each other.

15. The micro-LED wafer testing method of claim 10, wherein in the micro-LED wafer testing device placing step, at least one of a plurality of none-contacted members of the micro-LEDs that are not contacted by the dielectric portions is located between two of the contacted members that are contacted by adjacent two of the dielectric portions.

\* \* \* \* \*

10